(12) United States Patent
Spitz

(10) Patent No.: US 6,873,511 B2
(45) Date of Patent: Mar. 29, 2005

(54) RECTIFIER SYSTEM

(75) Inventor: Richard Spitz, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 187 days.

(21) Appl. No.: 10/182,520

(22) PCT Filed: Jan. 26, 2001

(86) PCT No.: PCT/DE01/00310

§ 371 (c)(1),
(2), (4) Date: Dec. 6, 2002

(87) PCT Pub. No.: WO01/58001

PCT Pub. Date: Aug. 9, 2001

(65) Prior Publication Data

US 2003/0142522 A1 Jul. 31, 2003

(30) Foreign Application Priority Data

Feb. 5, 2000 (DE) .......................................... 100 05 183

(51) Int. Cl.⁷ .............................................. H02H 5/00
(52) U.S. Cl. .......................... 361/104; 361/18; 361/58; 361/100

(58) Field of Search ................................. 361/104, 103, 361/58, 18, 78, 91.1, 100, 115

(56) References Cited

U.S. PATENT DOCUMENTS 4,670,970 A * 6/1987 Bajor .......................... 438/467
6,667,532 B2 * 12/2003 Haupt et al. ................. 257/528

FOREIGN PATENT DOCUMENTS

| DE | 195 49 202 | 7/1997 |
| DE | 199 08 697 | 9/2000 |
| EP | 0 282 025 | 9/1988 |
| SE | 661 151 | 6/1987 |

* cited by examiner

Primary Examiner—Stephen W. Jackson
(74) Attorney, Agent, or Firm—Kenyon & Kenyon

(57) ABSTRACT

A rectifier assembly including a fusible cutout is configured as a polarity reversal protection device. The fusible cutout includes a semiconductor chip having a positive temperature coefficient so that when it overheats, it becomes unsoldered and interrupts the current flow.

12 Claims, 4 Drawing Sheets

RECTIFIER SYSTEM

FIELD OF THE INVENTION

The present invention relates to a rectifier assembly.

BACKGROUND INFORMATION

A rectifier assembly is referred to in German Published Patent Application No. 199 08 697, although no fuse measures to protect against polarity reversal are discussed therein.

SUMMARY OF THE INVENTION

The exemplary rectifier assembly according to the present invention, i.e., the fusible cutout for use in a rectifier assembly, provides that the circuit may be interrupted at an early point in time, in particular in the case of polarity reversal, and thus prevent a fire caused by overheating of the rectifier elements. The fusible cutout provided for this purpose has the close manufacturing tolerances required in the range of high currents (100 A), so there is no risk of tripping the fuse mechanism during normal operation of the generator.

Exemplary embodiments of the present invention are illustrated in the drawings and explained in the following description.

DETAILED DESCRIPTION

Figure 1:
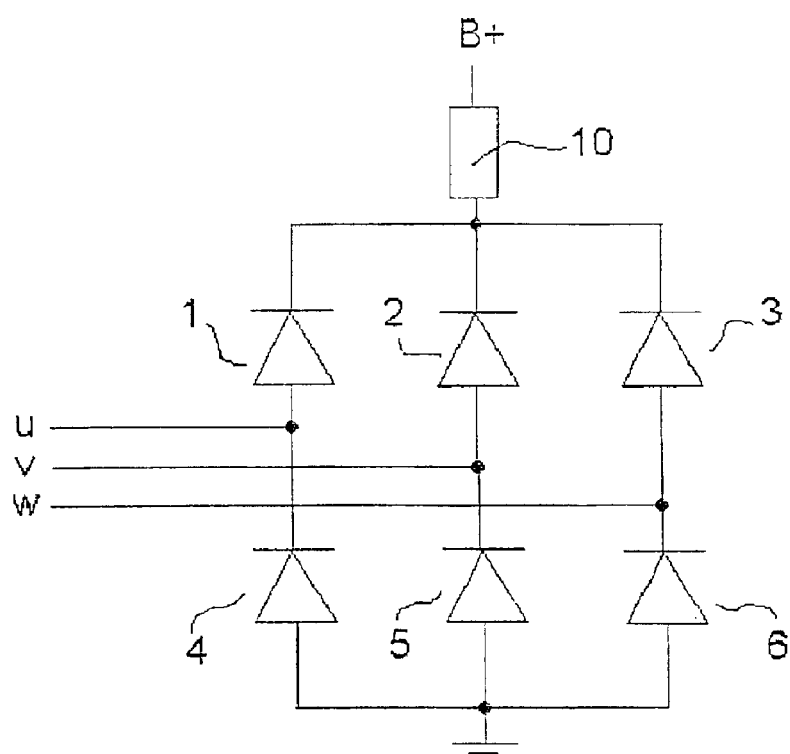
FIG. 1 shows a rectifier assembly.

FIG. 1 illustrates a rectifier assembly for a three-phase generator in a motor vehicle. The input includes three phase terminals u, v and w and is connected in a known manner to six semiconductor rectifier elements 1 through 6, in particular semiconductor diodes. The anodes of diodes 4, 5 and 6 are connected to a ground terminal. The cathodes of diodes 1, 2 and 3 are also connected to one another. They are connected to output B+ of the rectifier assembly across a fusible cutout 10.

The three-phase current of a three-phase generator whose three-phase terminals are connected to input u, v, w is rectified by the bridge rectifier formed by diodes 1 through 6. Output B+ is connectable to the positive pole of the vehicle battery, the negative pole is connected to ground, so the rectified current of the three-phase generator is able to charge the vehicle battery. The battery is prevented from discharging by the diodes of the rectifier. However if the poles of the battery are connected in reverse (e.g., in the case of a starting aid), the battery may discharge across the three diode segments 1, 4 or 2, 5 or 3, 6, which are thus connected in the direction of flow. Depending on the size of the battery and its charge, discharge currents of up to 900 A may result. Fusible cutout 10 is provided to prevent such discharge currents, which could last for more than 60 seconds, until the circuit would be interrupted due to destruction of the rectifier diodes or melting of feeder wires. This prevents hazardous situations in which high temperatures could occur in the rectifier components and cause ignition of plastic insulation, some of which could burn with a naked flame and trigger an automotive fire. The fusible cutout here is a silicon-based fuse, i.e., the same material as that of the rectifier elements.

Figure 2:
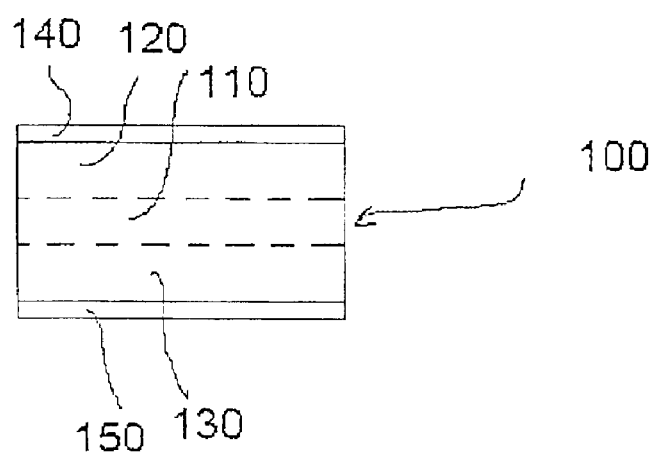
FIG. 2 shows the semiconductor chip of a fusible cutout.

FIG. 2 illustrates semiconductor chip 100 of fusible cutout 10. This semiconductor chip includes an n-doped middle zone 110, where the doping corresponds to the basic doping of the semiconductor wafer used in its production. Edge areas 120 and 130 of the chip are highly n-doped and are contactable via metallic coatings 140 and/or 150 applied to their outside surfaces.

The chip is soldered into a casing, which is also used for the diodes of the rectifier. This procedure is exactly the same as that known for rectifier diodes as referred to in German Published Patent Application No. 195 49 202, for example. The chip here is secured on a press-fit socket by using solder, and the head wire is soldered to the other side of the chip. Perpendicular to the direction of current flow, the chip includes a cross-sectional area approximately the same size as the corresponding cross-sectional area of a rectifier diode. This achieves the result that the thermal resistivity between the chip and the casing bottom is equal to the corresponding thermal resistivity of the rectifier diodes.

In another exemplary embodiment, highly doped zones 120 and 130 may be omitted and fusible cutout chip 100 may be made completely of an n-doped region 110.

The fusible cutout chip is made of a silicon wafer doped homogeneously with phosphorus, for example, having a thickness between 130 and 200 micrometers. The dopant concentration amounts to $10^{18}$ cm$^{-3}$, the specific resistance at 25 degrees Celsius is approximately 23 mΩcm. It is provided with a metallic coating on both sides to produce the exemplary embodiment without any additional doping steps and is divided into individual square chips having an edge length of approximately 4.5 millimeters. This yields a cross-sectional area of approximately 20 square millimeters, which is suitable for generator currents of more than 120 A. Coating with metal may be performed, for example, by sputtering with chromium, followed by nickel-vanadium and finally silver. The chips are divided by using a diamond saw. If the resistance of the fusible cutout chip is to be reduced, the configuration illustrated in FIG. 2 is expedient. In this case, before applying the metallic coating, additional doping of the wafer that has already been doped and a diffusion step are performed to produce highly n-doped regions 120 and 130.

Although the forward voltage of a diode has a negative temperature coefficient, the temperature coefficient of the homogeneously doped fusible cutout chip is positive. The resistance of the fusible cutout chip may therefore be adjusted so that in normal operation of the rectifier, the resistance and thus the electric power loss are comparable to the electric power loss of a rectifier diode. In the case of polarity reversal, the resistance of the fuse increases drastically due to the positive temperature coefficient. The increase in temperature unsolders the fusible cutout chip out of the casing and the circuit is broken after only a short battery discharge time. The resistance of the fuse is adjustable with a close tolerance, and the electric power loss is adapted to the power loss of the rectifier diodes through the doping and geometry. The cooling is also comparable due to the use of the same casing. Thus, in the event of a reversal of battery poles, the fuse will always become unsoldered before the rectifier diodes.

Figure 3:
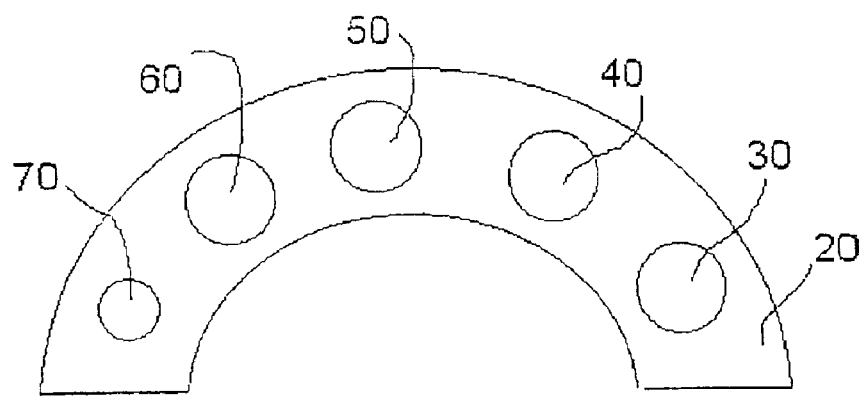
FIG. 3 shows a cooling plate.

FIG. 3 shows a top view of a cooling plate 20 including recesses 30, 40, 50, 60 and 70. Recesses 20, 30, 40, 50 60, and 70 have the same diameter.

To produce the rectifier assembly, rectifier diodes 1, 2 and 3, which are manufactured in the form of press-fit diodes, are pressed in a known manner into recesses 30 through 50. In the same manner, the casing of the fusible cutout chip, which is identical to the casings of the rectifier chips, is also pressed into recess 60. Recess 70 is used for mounting a contact for the fusible cutout chip. This contact is described below in the explanation of FIG. 4.

Figure 4:
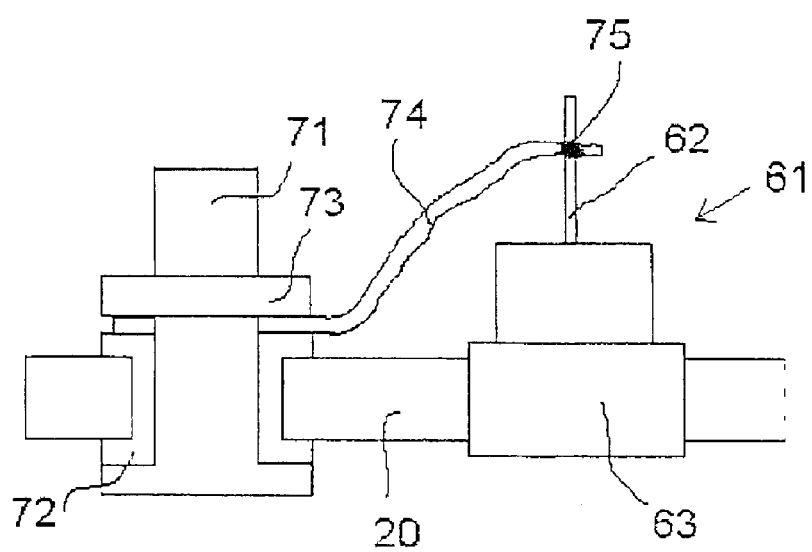
FIG. 4 shows the contacting of a fusible cutout.

FIG. 4 shows a detail of cooling plate 20 including a press-fit fusible cutout 61 which is pressed into recess 60, i.e., a press-fit casing, such as that also used for the rectifier diodes in which, however, a fusible cutout chip has been mounted instead of a diode chip. Fuse 61 is arranged with its press-fit socket 63 in recess 60 in the cooling plate. A contact screw 71 which is electrically insulated from the cooling plate by insulation 72 is introduced into recess 70. A contact wire 74 clamped by a contact nut 73 is electrically connected to head wire 62 of fusible cutout 61 via a soldered joint 75.

Contact screw 71 forms output B+ of the rectifier assembly. Current flows over cooling plate 20, which forms the electrical connection of the cathodes of diodes 1, 2 and 3, over press-fit socket 63 into the fuse and from there over head wire 62, contact wire 74 and contact screw 71 into the vehicle electrical system and/or the battery of the motor vehicle. The thermal resistivity between the bottom of the individual casing of the diodes (not shown here) and fuse 61 is identical. Diodes and the fusible cutout have the same cooling conditions. The total thermal resistivity between the chip (i.e., the diode chip or fusible cutout chip) and the cooling air is approx. 2 K/W at a rotational speed of 3000 rpm of the three-phase generator. In the case of a fusible cutout chip without highly doped regions 120, 130 of an n-doped silicon wafer having a specific resistance of 23 mΩcm at a temperature of 25 degrees Celsius, a chip thickness of 200 micrometers and a chip area of 20.3 square millimeters, an equilibrium temperature of 215 degrees Celsius is established on the fusible cutout chip with the cooling plate arrangement described here, e.g., in normal operation at a generator current of 120 A and a cooling air temperature of 120 degrees Celsius. The voltage drop amounts to approximately 0.4 volt, and the electric power loss is approx. 48 watt. In comparison with that, the chip temperature of the rectifier diodes is 182 degrees Celsius, the total power loss of the three diodes 1, 2 and 3 is 108 watt. The electric power loss may be further reduced by using chips having a smaller thickness of approx. 130 micrometers, for example. The equilibrium temperature on the fusible cutout chip is then 177 degrees Celsius, the voltage drop is 0.24 volt and the power loss is 28 watt (i.e., approx. 25% of the uniform power loss of the three diodes 1, 2 and 3 of 108 watt, which is independent of chip thickness).

What is claimed is:

1. A rectifier assembly, comprising:
   an input;
   a plurality of semiconductor rectifier elements for rectifying an electric periodic quantity applied to the input to provide a rectified electric periodic quantity;
   an output for picking off the rectified electric periodic quantity; and
   a fusible cutout connected between the plurality of semiconductor rectifier elements and the output, wherein the fusible cutout includes a semiconductor chip and the plurality of semiconductor rectifier elements and the semiconductor chip are made of the same semiconductor material.

2. The rectifier assembly of claim 1, wherein the plurality of semiconductor rectifier elements include a plurality of rectifier semiconductor chips surrounded by a first casing, and the semiconductor chip of the fusible cutout is surrounded by a second casing constructed in essentially the same manner as the first casing.

3. The rectifier assembly of claim 2, wherein the semiconductor chip of the fusible cutout and the plurality of rectifier semiconductor chips have the same cross-sectional-area perpendicular to a flow direction.

4. The rectifier assembly of claim 2, wherein the first casing and the second casing each include a plurality of press-fit sockets, and the plurality of semiconductor rectifier elements and the fusible cutout are pressed into a cooling plate in the same manner.

5. The rectifier assembly of claim 4, wherein the plurality of semiconductor rectifier elements are wired as bridge rectifiers, and the fusible cutout and the plurality of semiconductor rectifier elements are pressed into the cooling plate to allow positive components of the electric periodic quantity to pass through.

6. The rectifier assembly of claim 1, wherein the semiconductor chip of the fusible cutout includes three layers arranged in an $n^+/n/n^+$ layer sequence, and each of the three layers has a layer thickness that is approximately the same.

7. A fusible cutout for use in a rectifier assembly, comprising:
   a plurality of semiconductor rectifier elements; and
   a semiconductor chip that is heatable by a current flow and includes a plurality of soldered connections to a plurality of external contacts, wherein the plurality of soldered connections melt through in at least one location when a peak current load is exceeded and irreversibly interrupts the current flow through the semiconductor chip, and wherein the semiconductor chip and the plurality of semiconductor rectifier elements are made from a same semiconductor material.

8. The rectifier assembly of claim 3, wherein the first casing and the second casing each include a plurality of press-fit sockets, and the plurality of semiconductor rectifier elements and the fusible cutout are pressed into a cooling plate in the same manner.

9. The rectifier assembly of claim 6, wherein the plurality of semiconductor rectifier elements include a plurality of rectifier semiconductor chips surrounded by a first casing, and the semiconductor chip of the fusible cutout is surrounded by a second casing constructed in essentially the same manner as the first casing.

10. The rectifier assembly of claim 9, wherein the semiconductor chip of the fusible cutout and the plurality of rectifier semiconductor chips have the same cross-sectional-area perpendicular to a flow direction.

11. The rectifier assembly of claim 9, wherein the first casing and the second casing each include a plurality of press-fit sockets, and the plurality of semiconductor rectifier elements and the fusible cutout are pressed into a cooling plate in the same manner.

12. The rectifier assembly of claim 11, wherein the plurality of semiconductor rectifier elements are wired as bridge rectifiers, and the fusible cutout and the plurality of semiconductor rectifier elements are pressed into the cooling plate to allow positive components of the electric periodic quantity to pass through.

* * * * *